United States Patent [19]
Belek et al.

[11] Patent Number: 5,825,041
[45] Date of Patent: Oct. 20, 1998

[54] SYSTEM FOR OPTICAL CURING

[75] Inventors: Ronald E. Belek, Coventry; Robert Burger, Branford, both of Conn.

[73] Assignee: Loctite Corporation, Hartford, Conn.

[21] Appl. No.: 815,005

[22] Filed: Mar. 14, 1997

[51] Int. Cl.⁶ ........................................... F21V 7/12
[52] U.S. Cl. .................. 250/504; 250/493.1; 362/349; 362/347
[58] Field of Search .............. 250/504 R, 493.1; 362/349, 347

[56] References Cited

U.S. PATENT DOCUMENTS

| | | | |
|---|---|---|---|
| 2,245,762 | 6/1941 | De Stefani et al. | 250/455.1 |
| 3,433,949 | 3/1969 | Truhan | 250/455.1 |
| 3,676,667 | 7/1972 | Malifaud | 362/347 |
| 3,967,385 | 7/1976 | Culbertson | 34/4 |
| 4,048,916 | 9/1977 | Silverman et al. | 101/40 |
| 4,591,724 | 5/1986 | Fuse et al. | 250/492.1 |
| 4,694,180 | 9/1987 | Salisbury et al. | 250/455.1 |
| 4,924,599 | 5/1990 | Bubley | 34/4 |
| 5,440,137 | 8/1995 | Sowers | 250/504 R |

*Primary Examiner*—Jack I. Berman
*Attorney, Agent, or Firm*—Hoffmann & Baron, LLP

[57] ABSTRACT

An apparatus for projecting electromagnetic radiation onto a curing surface. The apparatus includes a housing containing the curing surface. The housing also includes a source of electromagnetic radiation and an elongate primary concave reflector. The source of electromagnetic radiation is positioned within an expanse defined by the primary reflector. The housing also includes a secondary reflector positioned adjacently exterior to the primary reflector expanse. The primary reflector and the secondary reflector operate to reflect and redirect radiation emanating from said source onto said curing surface.

20 Claims, 6 Drawing Sheets

SYSTEM FOR OPTICAL CURING

FIELD OF THE INVENTION

The present invention relates generally to a method and apparatus for curing an adhesive with electromagnetic radiation. More specifically, the present invention relates to a method and apparatus for reflecting electromagnetic radiation onto a curing surface.

BACKGROUND OF THE INVENTION

Adhesive is used extensively in many industries as an efficient means of joining two or more elements. In the electronics industry, adhesives are particularly used for supporting components on printed circuit boards. The inherent disadvantage of the use of adhesive is the time factor required for setting or curing the adhesive. This time problem has been solved to a great extent by the use of electromagnetic radiation curing. Exposure to electromagnetic radiation, including the ultraviolet (UV) and infrared (IR) spectrums, promotes curing through polymerization, or cross linking of monomers in the adhesive. In addition to a substantial saving of time, there is also a considerable saving in plant space, since an electromagnetic curing line is considerably shorter than previous systems, which for example, utilized heated gas ovens. Another advantage of electromagnetic curing is that there are no solvents to be discharged into the atmosphere. Since adhesive polymerizes completely, there is a substantial reduction in air pollution.

One of the most efficient electromagnetic radiation curing systems employs a tubular quartz lamp which includes mercury and argon and produces a high temperature electric arc. As shown in FIG. 1, a tubular quartz lamp 10 that produces the proper spectrum is generally cylindrical and provides a three hundred sixty degree (360°) illumination with respect to the longitudinal axis of lamp 10. Lamp 10 may be positioned near a curing surface 12 so as to project radiation thereon to effect curing.

It can be appreciated from FIG. 1 that the majority of emitted radiation does not directly strike the curing surface. The rays of illumination radiating from the lamp source can therefore be generally characterized as one of two types, direct rays 14 and escape rays 16. Direct rays 14 are those rays from the lamp 10 that propagate directly onto curing surface 12. The intensity of the direct rays at the curing surface is only affected by the distance between the curing surface and the lamp. That is, the further curing surface 12 is located from lamp 10, the less intense will be the electromagnetic radiation formed by the direct rays 14. Escape rays 16 are those rays emitted by lamp 10 that do not directly strike curing surface 12.

It is known in the prior art to capture some of the escape rays 16 by reflecting a portion thereof onto curing surface 12. Referring to FIG. 2, lamp 10 is positioned within the expanse 18 of an elongate elliptical primary reflector 20 having an inner reflective surface 22 so that a portion of the escape rays 16 are directed towards curing surface 12 after being reflected off elliptical reflective surface 22. Not all of the escape rays 16 are reflected off of reflective surface 22, however. Unless curing surface 12 were to fully span expanse 18 formed by reflective surface 22, some of the escape rays 16 will still not strike curing surface 12, either directly or by reflection.

As shown in FIG. 2, the escape rays 16 can therefore be further characterized as being either reflected rays 24 or evasive rays 26. Reflected rays 24 are those escape rays that will strike curing surface 12 after being redirected by reflective surface 22. Evasive rays 26 are those rays that still do not strike curing surface 12 even though reflective surface 22 is employed. The proportion of escape rays 16 that become reflected rays 24 or evasive rays 26 depends on the particular geometric configuration of reflective surface 22, the position of lamp 10 with respect to reflective surface 22, and the dimensions of curing surface 12. For example, the arrangement shown in FIG. 2, wherein reflector 22 is able to reflect onto curing surface 12 all the escape rays 16 striking thereon, the evasive rays 26 will simply be those rays emitted by lamp 10 that neither strike curing surface 12 nor reflective surface 22.

Were the curve of reflective surface 22 of primary reflector 20 derived from a truly elliptical arc and the lamp 10 located at one focal point for that ellipse, then the reflected rays 24 would all converge on the location of the second focal point for the progenitor ellipse. If the lamp were positioned elsewhere along the axis L than at the focal point, the reflected rays 24 would only symmetrically converge in an area 28 about axis L, as shown in FIG. 2, and then continually diverge. Depending on its distance from the primary reflector 20, curing surface 12 will therefore be subject to a different intensity of reflected rays 24. The varying intensity of the reflected rays 24 is represented in FIG. 2 by the different horizontal separation of the rays at curing surface 12 as opposed to that at curing surface 12' spaced therefrom.

Prior art curing systems employ such a curved reflector to help capture and redirect some of the escape rays 16, back onto the curing surface 12 as reflected rays 24. In these prior art curing systems, however, the evasive rays 26 were allowed to continue diverging away from the curing surface.

One such example is shown in U.S. Pat. No. 4,694,180. An oven for curing adhesive with UV radiation is provided. The UV oven includes a longitudinal UV lamp positioned within the expanse of a concave reflector for redirecting the escape rays emitted by the lamp towards a curing surface. The curing surface is located outside the expanse of the reflector such that this system will permit the evasive rays to miss the curing surface entirely. The device shown in the '180 patent makes no attempt to redirect the evasive rays emitted by the UV lamp towards the curing surface. Such systems require longer curing times or higher lamp intensity to adequately cure the adhesive on the curing surface than if the evasive rays were also directed onto the curing surface.

Another prior art curing system employs a UV lamp and reflectors to provide a fully elliptically shaped reflector. U.S. Pat. No. 4,591,724 discloses an elliptical reflector having a longitudinal UV lamp located at one foci of the elliptical shape. A coated optical fiber, which is to be cured, is run through a longitudinal hollow tube located at the second foci of the elliptical shape. Radiation radially emanates from the lamp and, as the reflector is elliptical, radially converges on the coated wire from all directions. While the disclosed device theoretically emits no stray radiation, such a layout would not be able to direct all its radiation onto one face of a planar curing surface which does not completely span the expanse of the reflector. In such a system, locating a curing surface within the expanse of the reflector could possibly expose the article including the curing surface to a risk of heat degradation. Furthermore, these systems effectively produce evasive radiation in that some radiation would only be reflected onto the underside of the curing surface and not onto the curing surface itself, thereby decreasing the amount of radiation striking the curing surface.

Higher curing system efficiency, or more complete use of emitted radiation, means less radiation needs to be emitted to effect curing. Reducing the required radiation output will also lower the IR output, due to the lower operating temperature required of the lamp when producing less radiation. A higher curing system efficiency is desirable for two reasons. First, less power will be required to effect curing of the adhesive on the curing surface. Second, while higher levels of UV radiation assist the curing process, the associated higher IR output the prior art systems would require results in a higher temperature at the lamp. Higher temperatures may degrade the plastic on which the adhesive is curing. It is therefore desirable to provide a system for curing an adhesive on a curing surface that makes maximum use of the radiation emitted by a radiation source.

It is also desirable to provide an apparatus and method of maximizing the intensity of the electromagnetic radiation at the curing surface by more efficiently redirecting any evasive rays into the curing surface.

SUMMARY OF THE INVENTION

It is therefore an object of the present invention to maximize the intensity of the electromagnetic spectrum emitted by a radiation source during the process of curing an adhesive by redirecting any rays that would otherwise not intersect a given curing surface onto the curing surface.

It is another object of the present invention to provide a method and apparatus for varying the intensity of the electromagnetic spectrum on a given curing surface.

It is another object of the present invention to provide a method and apparatus for curing an adhesive on a curing surface of varying dimensions.

It is still another object of the present invention to minimize the power required for a given radiation source to cure an adhesive.

In furtherance of these and other objectives, the present invention provides an apparatus for projecting electromagnetic radiation onto a curing surface. The apparatus includes a housing containing the curing surface. The housing also includes a source of electromagnetic radiation and an elongate primary concave reflecting surface having opposed longitudinal ends and opposed longitudinal edges. The reflective surface defines a primary reflector expanse and the source of electromagnetic radiation is positioned within the primary reflector expanse. The housing also includes a secondary reflecting member positioned adjacent and exterior to the primary reflector expanse. The source of electromagnetic radiation emits a first portion of electromagnetic radiation, a second portion of electromagnetic radiation, and a third portion of electromagnetic radiation. The first portion of electromagnetic radiation radiates from the source directly onto the curing surface. The second portion of electromagnetic radiation radiates directly from the source to the primary reflector which then reflects the second portion directly onto the curing surface. The third portion of electromagnetic radiation radiates directly from the source onto the secondary reflector, which then reflects the third portion of onto the curing surface.

DETAILED DESCRIPTION OF THE PREFERRED EMBODIMENT

Figure 1:
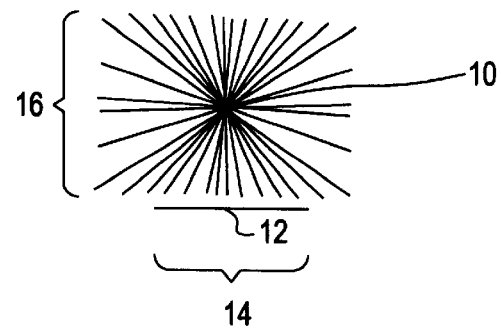
FIG. 1 depicts a schematic end-view the radiation pattern of a conventional elongate UV lamp.
Figure 2:
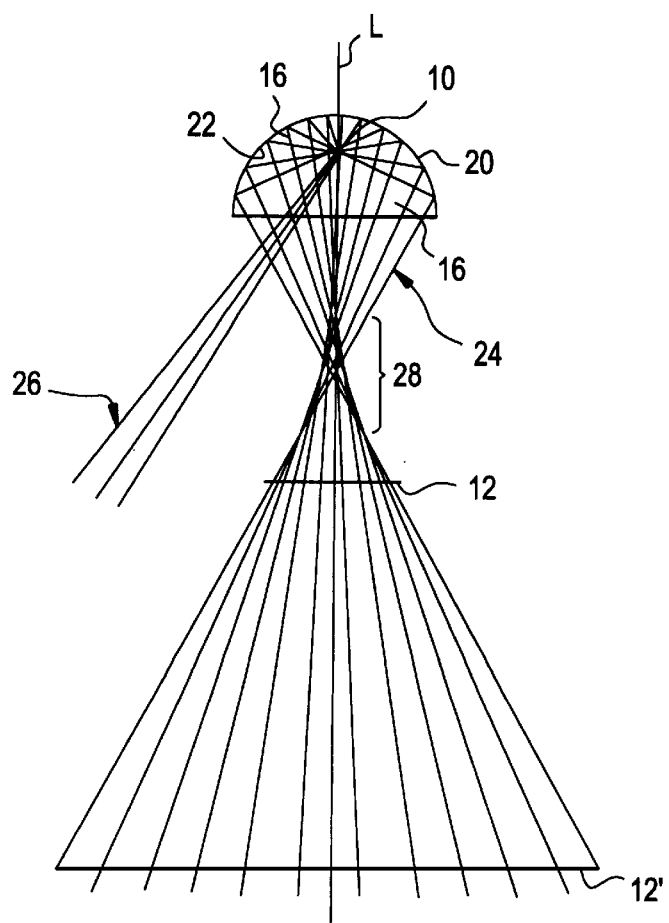
FIG. 2 depicts schematically the reflection of rays towards a curing surface by a primary elliptical reflector.
Figure 3:
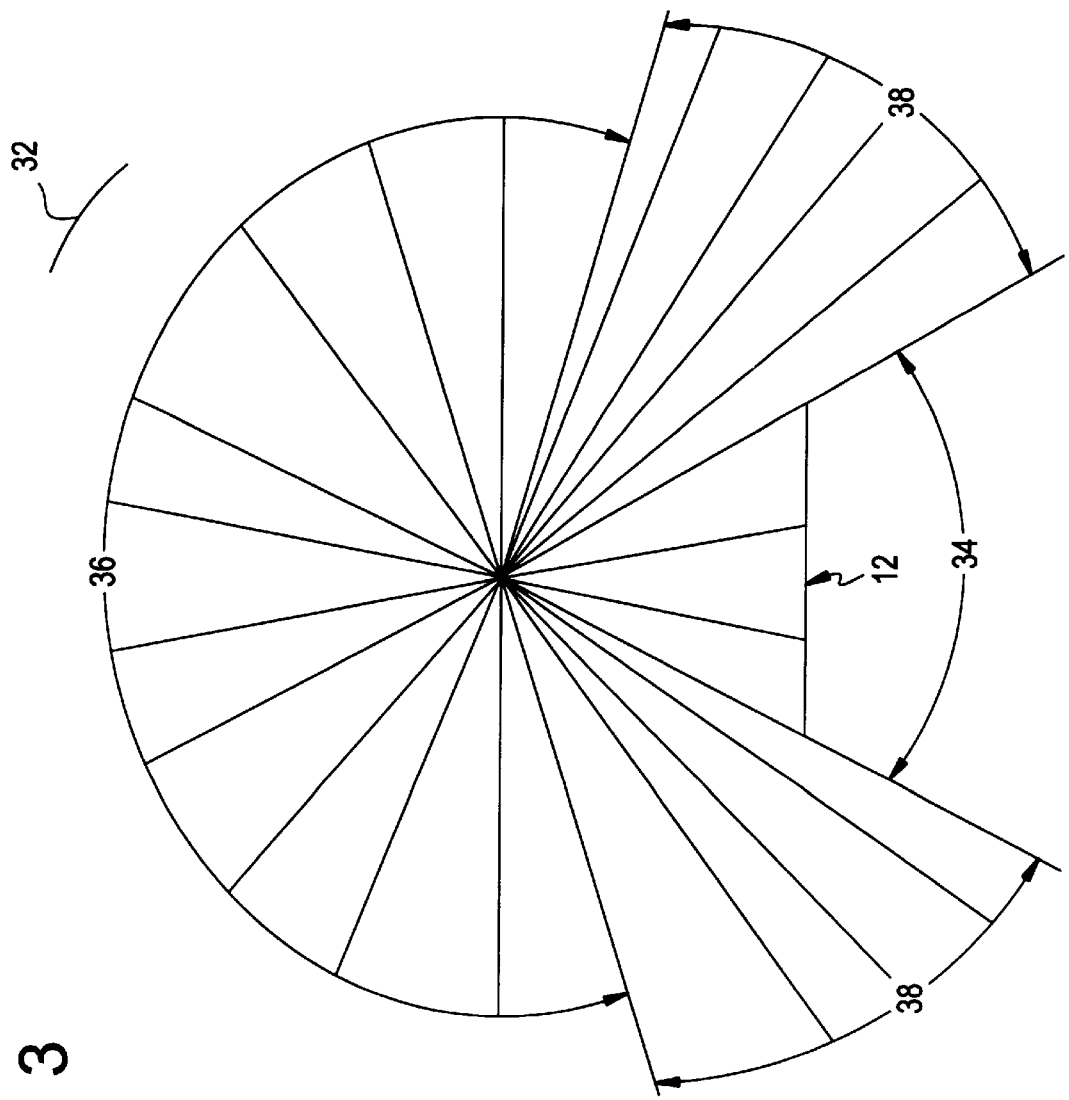
FIG. 3 shows the categorization of the radiation emitted by the lamp of FIG. 1.
Figure 6:
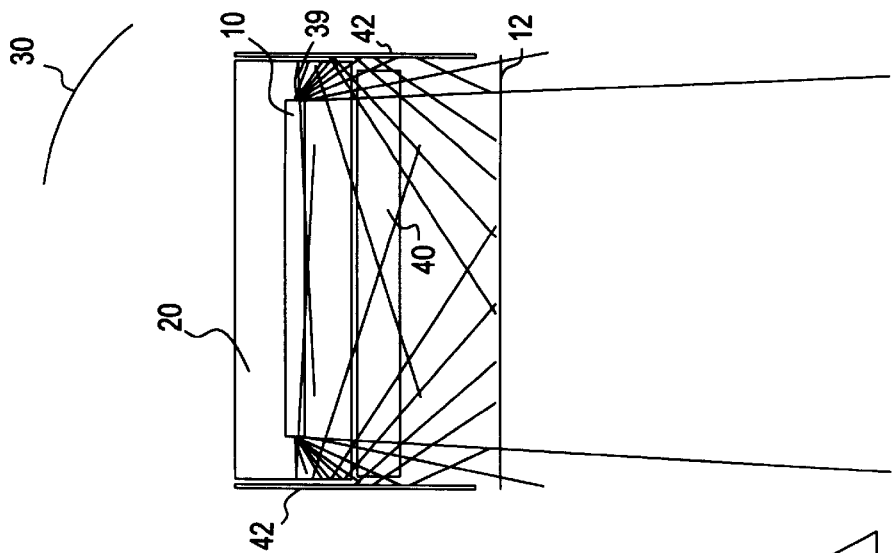
FIG. 6 is a side view of the assembly of the present invention including planar reflectors positioned at each longitudinal end of the primary reflector.
Figure 5:
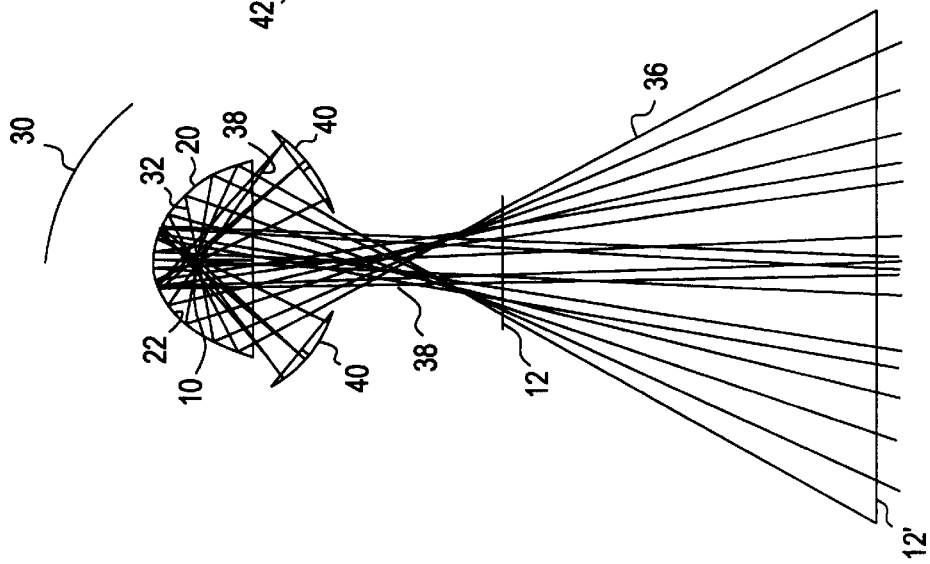
FIG. 5 shows a preferred embodiment of the present invention where a pair of secondary curved reflectors are employed to redirect rays back towards the primary reflector.
Figure 4:
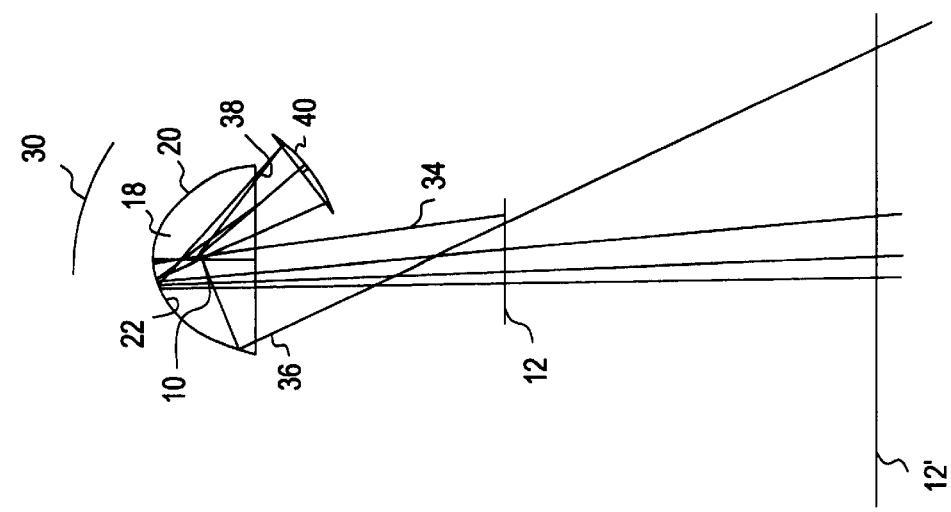
FIG. 4 shows a secondary curved reflector employed with an elliptical primary reflector of FIG. 2 for redirecting rays onto the curing surface.

Referring to FIGS. 4–6, a preferred embodiment of the present invention is illustrated. A primary reflector assembly 30 includes an elongate elliptical primary reflector 20 having an elongate cylindrical lamp 10 positioned within an interior expanse 18 defined by primary reflective surface 22 of primary reflector 20. Lamp 10 is typically a tubular quartz lamp which contains mercury and argon and produces a high temperature electric arc. Primary reflector assembly 30 is positioned in spaced separation above a curing surface 12. Curing surface 12 is generally a planar substrate having an electromagnetic radiation-curable coating thereon. For example, curing surface 12 may include a printed circuit board having electronic components supported thereon by a curable adhesive coating. With additional reference to FIG. 3, lamp 10 emits electromagnetic radiation 32 about three hundred sixty degrees of its longitudinal axis. The electromagnetic radiation emitted by lamp 10 includes radiation in the ultra violet and infrared spectrums. A first portion of the emitted radiation 32, referred to as direct rays 34, is emitted directly from lamp 10 onto curing surface 12 (FIG. 4). A second portion of the emitted radiation 32, referred to as reflected rays 36, is emitted directly onto primary reflective surface 22 from where it is reflected onto curing surface 12. A third portion of the emitted radiation 32, referred to as evasive rays 38, is emitted directly past both primary reflector 20 and curing surface 12.

FIG. 4 depicts schematically the method and apparatus of the present invention wherein evasive rays 38 are redirected onto curing surface 12. The present invention positions a curved reflector 40 adjacent the primary reflector assembly 30 so as to redirect the evasive rays 38 back onto the primary reflective surface 22 from where it is then reflected onto the curing surface 12. FIG. 5 is similar to FIG. 4, and depicts the preferred use of a pair of secondary curved reflectors 30 positioned adjacent lamp 10 and primary reflector 20 so that substantially all of the evasive rays 38 emitted by lamp 10 may be directed back to primary reflective surface 22 for redirection onto the curing surface 12.

As further shown with additional reference to FIG. 6, lamp 10 and primary reflector 20 are both elongate members. Secondary curved reflectors 30 are also elongate members positioned adjacent the entire length of reflector 20. The location of secondary curved reflectors 30 are preferably selected so that their position will not interfere with reflected rays 36 being reflected off of primary reflective surface 22, direct rays 34 being emitted onto the curing surface 12, or any of the evasive rays 38 reflected by primary reflector 20 onto curing surface 12. For clarity, direct rays 34 are not shown in FIG. 5.

FIG. 6 further illustrates an additional feature of the present invention. In addition to the radially emitted direct rays 34, reflected rays 36, and evasive rays 38, lamp 10 further emits end escape rays 39. End escape rays 39 project generally diagonally out from the longitudinal ends of lamp 10 and do not intersect curing surface 12. The preferred embodiment of the present invention includes end reflectors 42 located at each longitudinal end of primary reflector 20. Similar in purpose to secondary reflectors 30, end reflectors 42 redirect end escape rays 39 back towards curing surface 12. While FIG. 6 depicts end reflectors 42 as being planar and orthogonally aligned with curing surface 12, it is contemplated by the present invention that end reflectors 42 may be curved or otherwise angled so as to maximally reflect end escape rays 39 onto curing surface 12. The preferred embodiment of the present invention therefore will make maximum use of all the radiation emitted by lamp 10.

Figure 7:
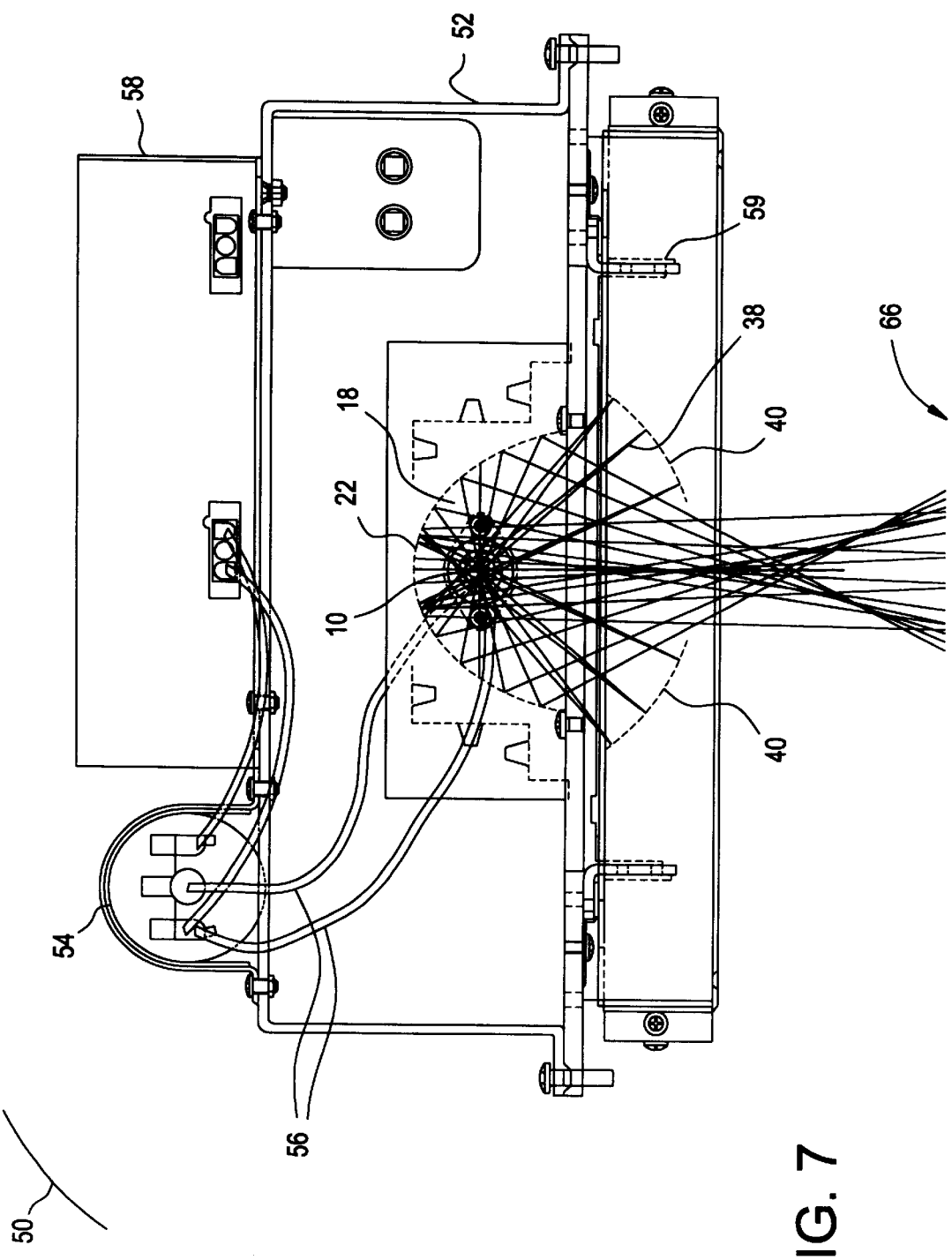
FIG. 7 is a front view of a UV curing apparatus employing the reflector assembly of FIG. 5.

FIG. 7 shows a reflector assembly 50 of the present invention. Reflector assembly 50 preferably includes primary reflector housing 52 and curved secondary reflectors 40. Primary reflector housing 52 includes elongate cylindrical lamp 10, elongate elliptical primary reflector 20, and end reflectors (not shown) abutting each of the opposed longitudinal ends of elliptical primary reflector 20. It is contemplated that reflector assembly 50 may include a power supply 54, power cables 56, and controller 58 as are known in the prior art. Preferably, lamp 10 is centrally located within the expanse 18 defined by primary reflector 20. Expanse 18 defined by primary reflector 20 is intended to communicate with a curing compartment (not shown) containing a surface to be cured. Secondary reflector bracket 59 mounts to reflector housing 52 so as to position secondary reflectors 40 adjacent primary reflector 20. Preferably, secondary reflectors 40 are elongate curved members which redirect evasive rays 38 off of primary reflector 20 and onto curing surface 12. It is contemplated that secondary reflector bracket 59 and secondary reflectors 40 may be retrofitted into existing electromagnetic radiation curing ovens employing a lamp 10 and an elongate concave reflector.

Figure 8:
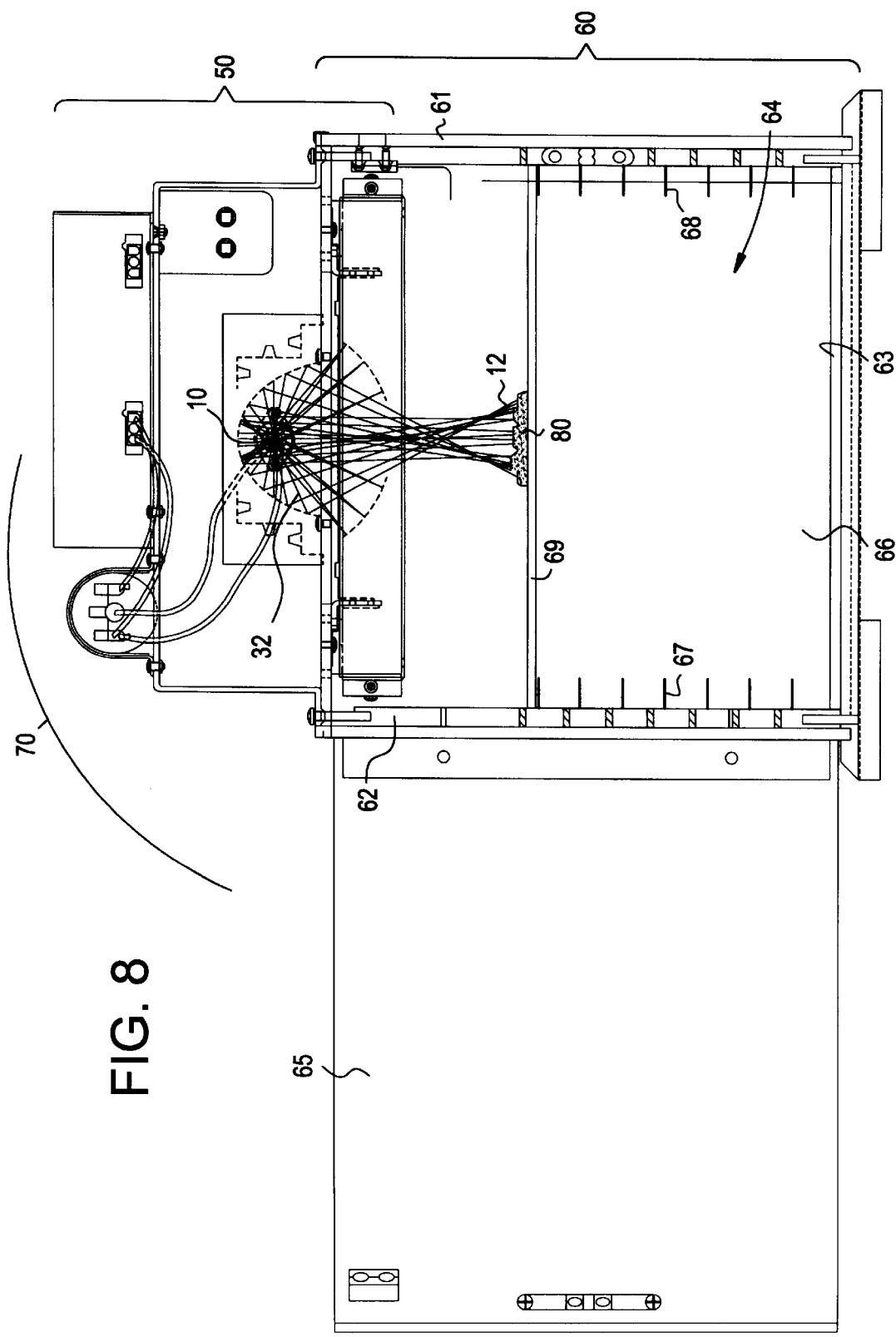
FIG. 8 is a frontal view of a UV curing oven employing the UV curing apparatus of FIG. 7.

Referring now to FIG. 8, the reflector assembly 50 of the present invention may be employed in combination with an electromagnetic radiation curing oven compartment 60 of the type employed in the prior art to form curing oven 70. Oven compartment 60 includes opposed side walls 61, 62 contiguous with a bottom surface 63 and back surface 64. Oven compartment also includes door 65 openably fastened to wall 62 to provide operator access to interior chamber 66. Reflector assembly 50 and oven compartment 60 define sealed interior chamber 66 which contains curing surface 12. Side walls 61 and 62 further include transversely aligned holding flanges 67, 68. Holding flanges 67, 68 are transversely aligned so as to permit removable insertion of curing shelf 69 supporting an article 80 having adhesive-covered curing surface 12. Holding flanges 67, 68 provide for variable placement of curing surface 12 with respect to reflector assembly 50 allowing operator control and selection of the spectral intensity at the curing surface 12 by varying the distance between reflector assembly 50 and curing surface 12. Curing oven 70 provides containment of all electromagnetic radiation 32 emitted by lamp 10. Curing oven 70 also includes mechanical and electrical safety means and cooling means (not shown) to prevent hazardous operation of the oven as is known in the prior art.

Figure 9C:
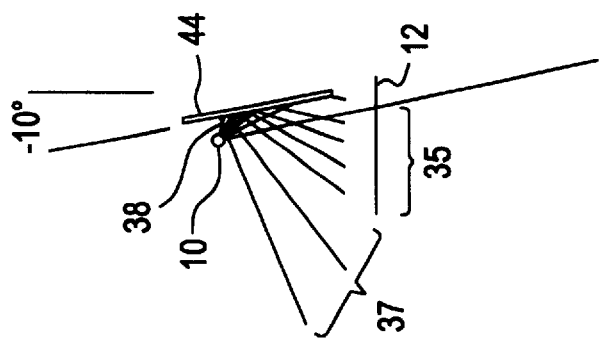
FIGS. 9A–C show alternate embodiments of the present invention employing planar secondary reflectors.
Figure 9B:
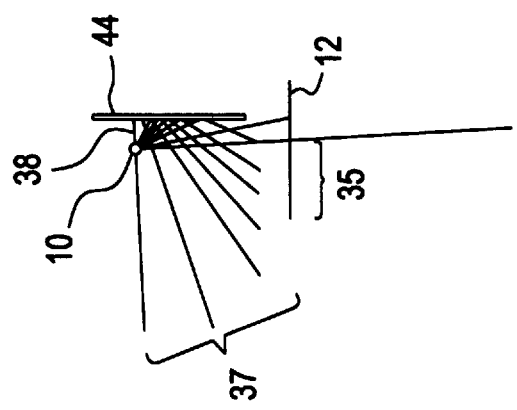
Figure 9A:
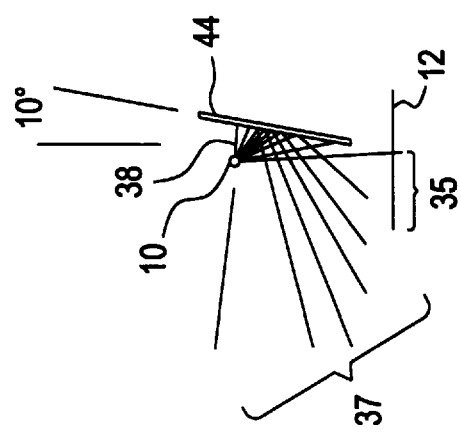

FIGS. 9A–C show schematic representations of further embodiments of the present invention in which the evasive rays 38 are redirected directly towards the curing surface 12. While each of these embodiments contemplate locating planar secondary reflectors adjacent an elongate concave reflecting surface as previously described, for clarity the primary reflector is not shown in FIGS. 9A–C. FIG. 9A depicts a planar reflector 44 positioned adjacent lamp 10 in the path of the evasive rays 38 and at approximately a 10° angle to an orthogonal to curing surfaces 12. FIG. 9B depicts a secondary planar reflector 44 orthogonally aligned with the curing surfaces 12. Similarly, FIG. 9C illustrates secondary planar reflector 44 having a negative alignment with respect to an orthogonal to the curing surfaces 12. In each of the embodiments of positioning a secondary planar reflector illustrated by FIGS. 9A–C, some of the evasive rays 38 emitted by lamp 10 are reflected directly onto the curing surface 12 as redirected radiation 35. While each of these embodiments continue to provide stray radiation 37 which still will not intersect curing surface 12, certain of the evasive rays 38 are directed towards curing surface 12.

It is contemplated that the primary reflector may have a shape other than elliptical. Even though the reflective characteristics of merely concave reflectors may be less efficient for reflecting radiation onto a curing surface, the present invention would still be arranged to optimize the curing characteristics provided by the reflector assembly. For these non-elliptical primary reflectors, the focal point where the lamp 10 would be located is defined as the point within the reflector expanse that maximizes the radiation reflected onto the curing surface. Furthermore, it is contemplated that reflector assembly 50 may positioned above a conveyor belt (not shown) on which the curing surface is placed. As reflector assembly 50 includes all of the reflecting surfaces provided by the present invention, the choice for how or where the curing surface is located therebelow may be configured differently as required by a particular manufacturing process.

While the preferred embodiment of the present invention has been shown and described, it will be obvious in the art that changes and modifications may be made without departing from the teachings of the invention. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. An apparatus for directing electromagnetic radiation onto a substrate comprising:

an electromagnetic radiation source for emitting electromagnetic radiation onto said substrate spaced therefrom;

a primary curved reflective surface defining an expanse and having a central axis extending from said expanse, said source being positioned along said central axis adjacent said primary curved reflective surface, said primary curved reflective surface being capable of reflecting a first portion of said electromagnetic radiation emanating from said source onto said substrate; and at least one secondary reflecting member positioned substantially adjacent to said radiation source, said secondary reflecting member being positioned so as to redirect a second portion of said electromagnetic radiation emanating from said source onto said primary reflective surface so as to converge upon said central axis beyond said secondary reflector towards said substrate.

2. The apparatus of claim 1, wherein said electromagnetic radiation is ultraviolet radiation.

3. The apparatus of claim 1, wherein said primary curved reflective surface is generally an elongate curved surface having a longitudinal axis; and wherein said radiation source is an elongate generally tubular member having a longitudinal axis which is generally parallel to said longitudinal axis of said primary curved reflective surface.

4. The apparatus of claim 1, wherein said primary curved reflective surface is generally in the shape of a segment of an ellipse.

5. The apparatus of claim 4 wherein said source is positioned adjacent a first focal point of said ellipse and said substrate is positioned generally adjacent a second focal point of said ellipse.

6. The apparatus of claim 5, wherein said substrate is variably located with respect to said second foci to vary the intensity of said electromagnetic radiation projected onto said substrate.

7. The apparatus of claim 4, further including an additional secondary curved reflecting member wherein each of said secondary curved reflecting members are located outwardly adjacent opposite ends of said ellipse segment defining said primary curved reflective surface.

8. A method of curing an electromagnetic radiation-curable coating on a substrate using electromagnetic radiation, said method comprising the steps of:

providing a holding surface for accommodating said coated substrate;

locating a primary electromagnetic radiation reflector at a position spaced from said coated substrate, said primary electromagnetic radiation reflector defining a reflector expanse and having a central axis extending from said primary electromagnetic radiation reflector through said reflector expanse;

positioning an electromagnetic radiation source along said central axis between said coated substrate and said primary reflector such that as said source emits electromagnetic rays certain of said electromagnetic rays being emitted onto said coated substrate, other electromagnetic rays being emitted onto said primary reflector and reflected onto said coated substrate, and additional electromagnetic rays being emitted away from said coated substrate and said primary reflector; and locating a second electromagnetic radiation reflector at a position adjacent said primary reflector such that a portion of said additional electromagnetic rays are redirected by said secondary reflector towards said primary reflector so as to converge upon said central axis beyond said secondary reflector towards said coated substrate.

9. The method of claim 8, further including the step of locating a third electromagnetic radiation reflector at a position adjacent said primary reflector and said second reflector such that said additional electromagnetic rays are redirected by said third reflector towards said primary reflector so as to converge upon said central axis beyond said third electromagnetic radiation reflector towards said coated substrate.

10. The method of claim 8, wherein said positioning step further includes positioning said source interior of an expanse defined by said primary reflector.

11. The method of claim 8, further including the step of locating said second reflector and said third reflector exterior of said expanse.

12. The method of claim 8, wherein said primary reflector is generally elliptical in shape.

13. The method of claim 8, further including the step of moving said holding surface with respect to said source to select the radiation intensity projected onto said coated substrate.

14. A curing chamber for projecting electromagnetic radiation, comprising:

a curing surface onto which said electromagnetic radiation is projected;

a source of said electromagnetic radiation;

a primary reflector including an elongate primary concave reflecting surface having opposed ends and opposed longitudinal edges, said longitudinal edges defining a primary reflector expanse having a central axis extending therethrough from said primary reflector, said source of electromagnetic radiation being positioned along said central axis interior of said primary reflector expanse;

a secondary reflecting member positioned adjacent said primary reflector, exterior of said primary reflector expanse;

wherein said source emits said electromagnetic radiation including:

a first portion of said electromagnetic radiation, said first portion radiating from said source directly onto said curing surface, and a second portion of said electromagnetic radiation, said second portion radiating directly from said source to said primary reflecting surface, wherein said primary reflecting surface reflects said second portion onto said curing surface, a third portion of said electromagnetic radiation, said third portion radiating directly from said source onto said secondary reflecting member, wherein said secondary reflecting member reflects said third portion onto said primary reflecting surface so as to be redirected towards said central axis beyond said secondary reflecting member towards said curing surface.

15. The apparatus of claim 14, wherein said electromagnetic radiation is ultraviolet radiation.

16. The apparatus of claim 14, including means for selectively positioning said curing surface below said radiation source.

17. The apparatus of claim 14, wherein said secondary reflecting member includes two spaced-apart elongate curved reflecting surfaces.

18. The apparatus of claim 14, further including a housing, said housing enclosing said curing surface, said radiation source, said primary reflecting surface, and said secondary reflecting member, said housing providing sealed retention of said electromagnetic radiation.

19. The apparatus of claim 14, wherein said concave shape of said elongate primary reflector surface forms an ellipse.

20. The apparatus of claim 19, wherein said source is located at a focal point of said elliptical primary reflector.

* * * * *